(12) United States Patent
Machida et al.

(10) Patent No.: US 8,278,163 B2
(45) Date of Patent: Oct. 2, 2012

(54) SEMICONDUCTOR PROCESSING APPARATUS AND SEMICONDUCTOR PROCESSING METHOD

(75) Inventors: Akio Machida, Kanagawa (JP); Toshio Fujino, Kanagawa (JP); Tadahiro Kono, Kanagawa (JP); Katsuji Takagi, Kanagawa (JP); Shinsuke Haga, Kanagawa (JP)

(73) Assignee: Sony Corporation, Tokyo (JP)

( * ) Notice: Subject to any disclaimer, the term of this patent is extended or adjusted under 35 U.S.C. 154(b) by 188 days.

(21) Appl. No.: 12/507,985

(22) Filed: Jul. 23, 2009

(65) Prior Publication Data
US 2010/0051830 A1 Mar. 4, 2010

(30) Foreign Application Priority Data
Jul. 30, 2008 (JP) .................................. 2008-195956

(51) Int. Cl.
*H01L 21/268* (2006.01)
*G21K 5/10* (2006.01)
(52) U.S. Cl. ..................... 438/166; 438/799; 250/492.2; 257/E21.328
(58) Field of Classification Search ............... 250/492.1, 250/492.2, 492.22; 438/166, 795–797, 799
See application file for complete search history.

(56) References Cited

U.S. PATENT DOCUMENTS

| | | | | |
|---|---|---|---|---|
| 7,253,864 B2 * | 8/2007 | Kikuchi et al. | ............... | 349/144 |
| 7,311,778 B2 * | 12/2007 | Im et al. | ........................ | 117/200 |
| 2003/0094585 A1 * | 5/2003 | Hara et al. | ............... | 250/492.23 |
| 2006/0118036 A1 * | 6/2006 | Takeda et al. | .................... | 117/89 |
| 2007/0178674 A1 * | 8/2007 | Imai et al. | ...................... | 438/487 |
| 2007/0212860 A1 | 9/2007 | Fujino et al. | | |
| 2008/0054266 A1 * | 3/2008 | Machida et al. | ................. | 257/66 |

FOREIGN PATENT DOCUMENTS

| | | | |
|---|---|---|---|
| JP | 09-260681 | | 10/1997 |
| JP | 2000-091231 | | 3/2000 |
| JP | 2000091231 A | * | 3/2000 |
| JP | 2003-031497 | | 1/2003 |
| JP | 2003-045820 | | 2/2003 |
| JP | 2003-059858 | | 2/2003 |
| JP | 2004-087535 | | 3/2004 |
| JP | 2004-087667 | | 3/2004 |
| JP | 2007-281420 | | 10/2007 |
| JP | 2007-281422 | | 10/2007 |

OTHER PUBLICATIONS

Japanese Patent Office Action corresponding to Japanese Serial No. 2008-195956 dated Jun. 15, 2010.

\* cited by examiner

*Primary Examiner* — Robert Kim
*Assistant Examiner* — David E Smith
(74) *Attorney, Agent, or Firm* — SNR Denton US LLP

(57) ABSTRACT

A semiconductor processing apparatus includes: a stage on which a substrate having a semiconductor film to be processed is to be mounted; a supply section that supplies a plurality of energy beams onto the semiconductor film mounted on the stage in such a way that irradiation points of the energy beams are aligned at given intervals; and a control section that moves the plurality of energy beams and the substrate relative to each other in a direction not in parallel to alignment of the irradiation points of the plurality of energy beams supplied by the supply section, and scans the semiconductor film with the irradiation points of the plurality of energy beams in parallel to thereby control a heat treatment on the semiconductor film.

9 Claims, 14 Drawing Sheets

INTERFERENCE POINT n

SCAN DIRECTION

OPTICAL FIBERS

SEMICONDUCTOR PROCESSING APPARATUS AND SEMICONDUCTOR PROCESSING METHOD

BACKGROUND OF THE INVENTION

1. Field of the Invention

The present invention relates to a semiconductor processing apparatus and a semiconductor processing method which irradiate energy beams onto a semiconductor film provided on a substrate to crystallize the semiconductor film by a heat treatment.

2. Description of the Related Art

Flat type display devices, such as a liquid crystal display device and an organic EL (Electro Luminescence) display device, use thin film transistors (Thin Film Transistors: TFTs) as switching elements for effecting active matrix display of a plurality of pixels.

Thin film transistors include a polycrystalline silicon TFT which uses a polysilicon (poly-Si), microcrystalline silicon (μc-Si) or the like in an active region, and an amorphous silicon TFT which uses an amorphous silicon (amorphous Si) in an active region. Of the two types of TFTs, the polysilicon TFT has a feature that the carrier mobility is greater by ten to 100 or so times as compared with the amorphous silicon TFT, and thus has an excellent characteristic as a material for a switching element.

Because existing pixel switching elements for driving a liquid crystal do not need such a high carrier mobility, amorphous silicon TFTs are generally used as pixel switches. It is however desirable to use switching elements which have a higher carrier mobility than that of the amorphous silicon TFT in organic EL or high frame usage which is expected to be used in the next generation TFTs.

However, the characteristics of the polycrysilicon TFT, such as carrier mobility and threshold voltage, are likely to vary from one device to another due to the presence of both a crystal region and a grain boundary region in a channel region which is the core of the transistor. It is said that the carrier mobility and the device variation have a trade-off relation such that as the carrier mobility becomes greater, the device variation becomes larger.

Multiple studies have been done on such a relation originating from the unique grain boundary of the polysilicon TFT.

For example, JP-A-2004-87535 (Patent Document 1) discloses a technique of irradiating an excimer laser beam over a diffraction grating mask in addition to a control method for the crystal orientation in repetitive irradiation. That is, positional control on the grain boundary is carried out with the diffraction grating mask in such a way that crystal growth occurs at a point of the intensity-modulated minimum light intensity as the origin, and the position of the grain boundary is set to a point of the maximum light intensity.

As another technique, a scheme of crystallization with laser scanning is disclosed. For example, JP-A-2004-87667 (Patent Document 2) discloses SELAX (Selectively Enlarging Laser Crystallization). This method moves (scans) a continuous wave (CW) laser beam or a pseudo CW laser beam with a very high pulse frequency of several tens of MHz or so in one direction in relative to a silicon film deposited on a substrate.

The laser scanning causes a crystal to grow in one direction. The grain boundary is formed substantially in parallel to the direction of growth. Therefore, the electric conduction in the direction of crystal growth reduces the density of the grain boundary where carriers cross, thus making it possible to increase the carrier mobility.

The closer to a monocrystal the channel portion becomes, the more prominent a difference in in-plane crystal orientation, a slight angular difference in plane orientation, and a difference in internal defect become. It is therefore desirable to form a crystal film of a higher quality of the level of a monocrystalline Si substrate to suppress a device variation.

JP-A-2007-281422 (Patent Document 3) discloses a technique of forming a polycrystal with a controlled number of grain boundaries where carriers cross, not making silicon in the channel into a monocrystal. Further, JP-A-2007-281420 (Patent Document 4) discloses a technique of scanning a channel region with a spot laser beam at equal pitches to form grain boundaries. This makes it possible to form a transistor with a smaller device variation while having a relatively high carrier mobility.

SUMMARY OF THE INVENTION

Those schemes however have a problem of making it difficult to increase the throughput. That is, it is necessary to carry out beam scanning a number of times to crystallize a silicon film in the channel with a beam of a small spot size, and this requirement stands in the way of improving the productivity.

Accordingly, it is desirable to provide a technique capable of improving the throughput in forming a semiconductor device through a heat treatment on a semiconductor film using an energy beam.

According to an embodiment of the present invention, there is provided a semiconductor processing apparatus including a stage on which a substrate having a semiconductor film to be processed is to be mounted, a supply section that supplies a plurality of energy beams onto the semiconductor film mounted on the stage in such a way that irradiation points of the energy beams are aligned at given intervals, and a control section that moves the plurality of energy beams and the substrate relative to each other in a direction not in parallel to alignment of the irradiation points of the plurality of energy beams supplied by the supply section, and scans the semiconductor film with the irradiation points of the plurality of energy beams in parallel to thereby control a heat treatment on the semiconductor film.

According to another embodiment of the present invention, there is provided a semiconductor processing method including the steps of supplying a plurality of energy beams onto a semiconductor film provided on a substrate to be processed in such a way that irradiation points of the energy beams are aligned at given intervals, and moving the plurality of energy beams supplied and the substrate relative to each other in a direction not in parallel to alignment of the irradiation points of the plurality of energy beams supplied by the supply section, and scans the semiconductor film with the irradiation points of the plurality of energy beams in parallel to thereby control a heat treatment on the semiconductor film.

According to the embodiments of the invention, a substrate is scanned with a plurality of energy beams in parallel with the irradiation points of the energy beams aligned at given intervals, thus making it possible to increase the number of regions to be processed at a time as compared with a case of scanning a substrate with a single beam irradiation point.

The present invention can therefore improve the throughput in forming a semiconductor device through a heat treatment on a semiconductor film using an energy beam.

DETAILED DESCRIPTION OF THE PREFERRED EMBODIMENT

A preferred embodiment of the present invention is described below with reference to the accompanying drawings. A semiconductor processing apparatus according to the embodiment, which is described herein, is the apparatus that is used in crystallization and activation of an amorphous semiconductor film of silicon, germanium or the like formed on a substrate in the process of crystallization/activation of a so-called semiconductor film.

<Schematic Configuration of Semiconductor Processing Apparatus>

Figure 1:
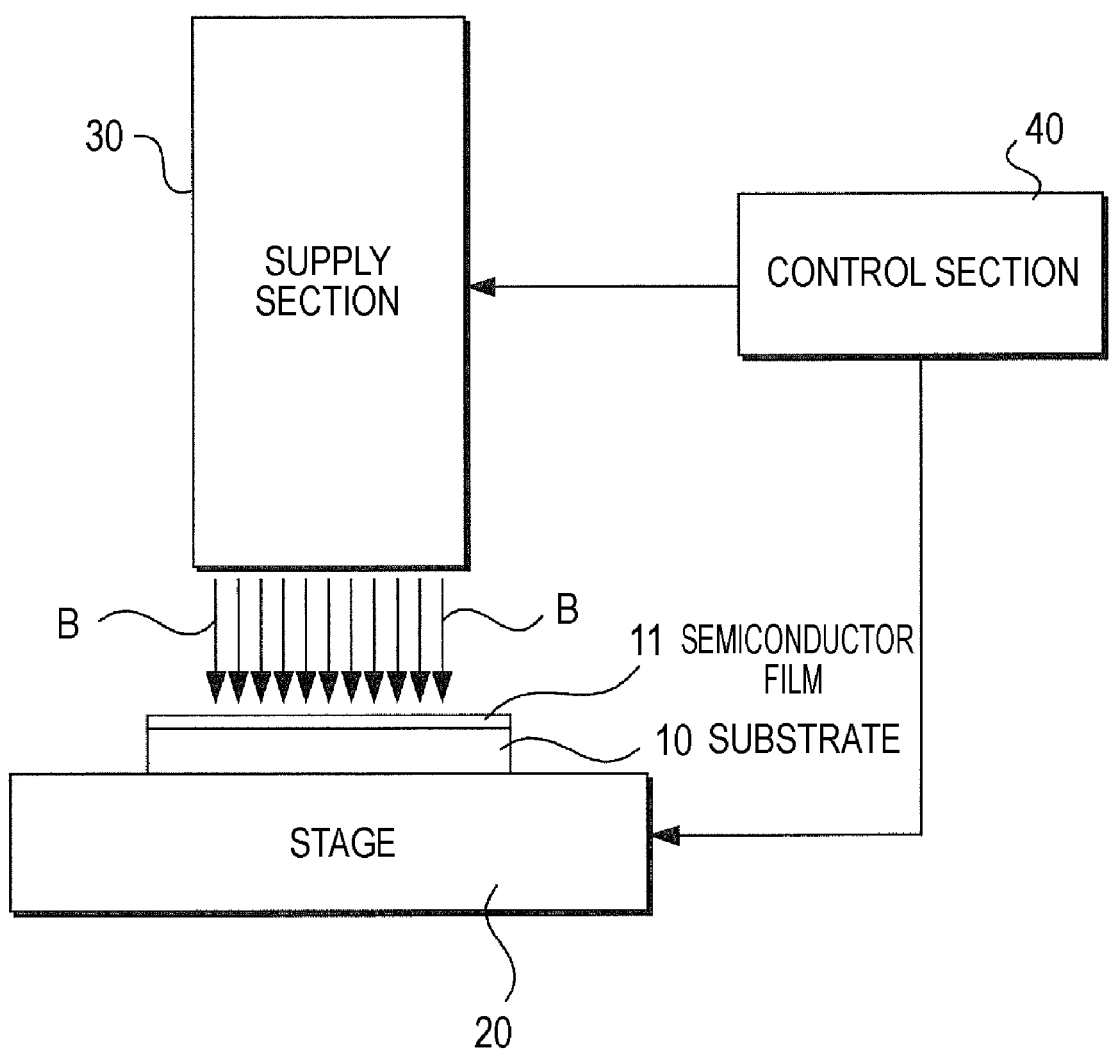
FIG. 1 is a diagram illustrating the schematic configuration of a semiconductor processing apparatus according to an embodiment of the present invention.

FIG. 1 is a diagram illustrating the schematic configuration of the semiconductor processing apparatus according to the embodiment. The semiconductor processing apparatus according to the embodiment includes a stage 20 on which a substrate 10 having a semiconductor film 11 to be processed is to be mounted, a supply section 30 that supplies energy beams, and a control section 40 that controls the stage 20 and the irradiation of the energy beams.

The stage 20 has a capability of moving the substrate 10 mounted thereon in vertical and horizontal (XY) directions.

The stage 20 has a capability of moving the substrate 10 in the altitude (Z) direction and in the rotational (θ) direction as needed.

The supply section 30 supplies a plurality of energy beams B onto the semiconductor film 11 mounted on the stage 20 in such a way that irradiation points of the energy beams B are aligned at given intervals. A laser beam is used as the energy beam B. Therefore, the supply section 30 has a light source part which emits a laser beam, a beam shaper which shapes the laser beam emitted from the light source part, and a dividing part which divides the laser beam into a plurality of energy beams B.

The control section 40 controls the movement of the stage 20 in the in the XY directions, and in the Z direction and the θ direction as needed, and gives an instruction to the supply section 30 to control the amount of energy of the energy beams B. Accordingly, the state of a heat treatment on the semiconductor film 11 on the substrate 10 is controlled.

<Specific Example of Semiconductor Processing Apparatus>

Figure 2:
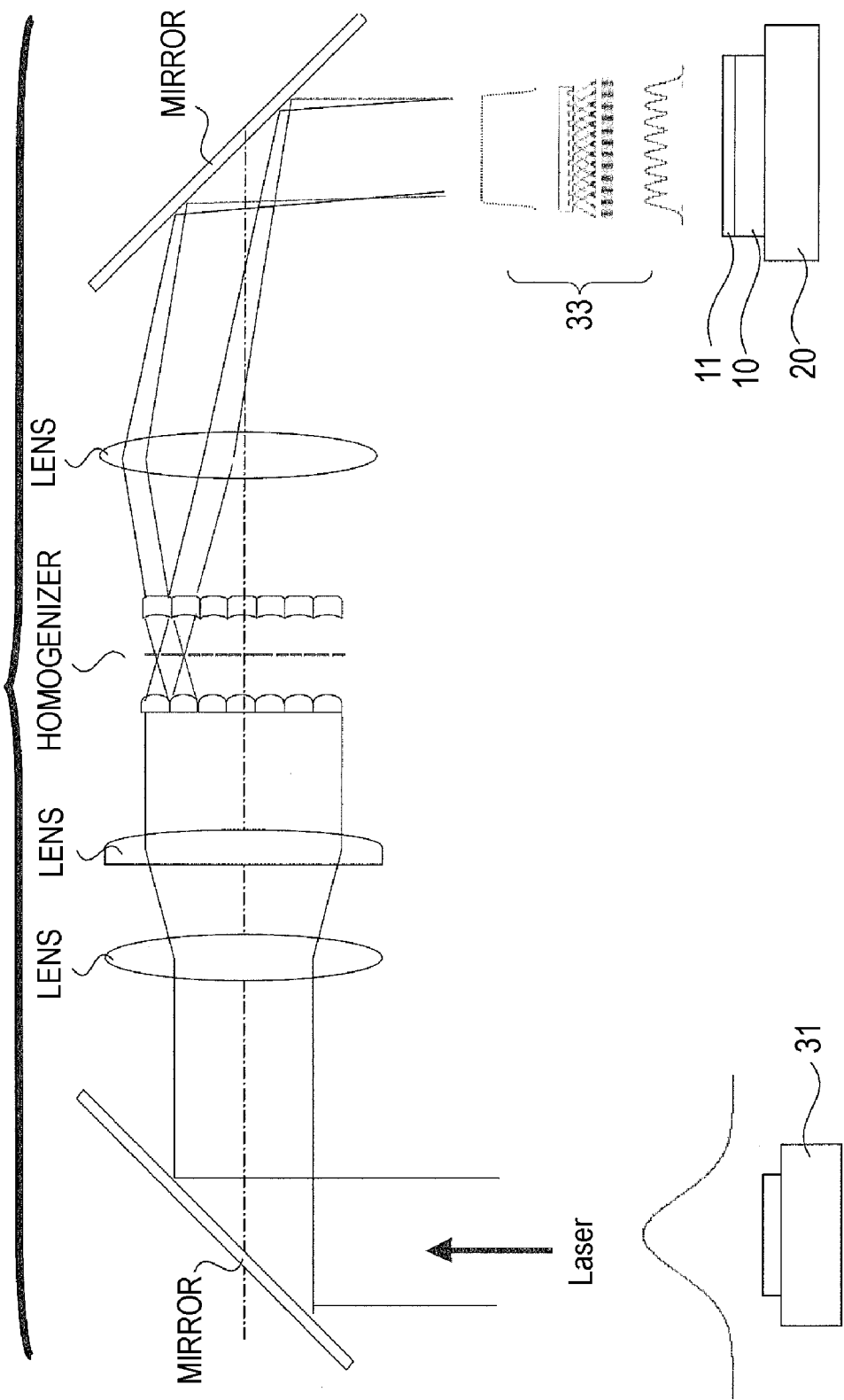
FIG. 2 is a configurational diagram illustrating a specific example of the semiconductor processing apparatus according to the embodiment.

FIG. 2 is a configurational diagram illustrating a specific example of the semiconductor processing apparatus according to the embodiment. The semiconductor processing apparatus shown in FIG. 2 includes the stage 20 on which the substrate 10 is mounted, a light source part 31 which generates a laser beam, a laser beam combining part, a beam shaper 32 which shapes the irradiation shape of the laser beam, and a diffraction grating mask irradiator 33 which is a dividing part to subject the laser beam to intensity modulation to divide the laser beam. The light source part 31, the beam shaper 32 and the diffraction grating mask irradiator 33 are provided in the supply section 30 shown in FIG. 1, and those components and the stage 20 are controlled by the control section 40.

Of the components, the stage 20 is configured to be provided with a slider capable of keeping the substrate 10 mounted on the stage 20 horizontally, and freely moving/scanning the substrate 10 in the X-Y direction in the horizontal plane. In case where the substrate 10 mounted on the stage 20 has a flexibility and is bent flexibly, the stage 20 may be configured to have a roll-to-roll type roll-up mechanism at an end portion to roll up the substrate 10 in one direction (e.g., plus or minus Y direction) in which the substrate 10 is scanned.

The light source part 31 includes a semiconductor laser oscillator. As the semiconductor laser oscillator, one which generates a laser beam having the adequate characteristic and wavelength according to what process is to be executed using the semiconductor processing apparatus is selected.

In case where the semiconductor processing apparatus is used in crystallization and activation of a semiconductor film formed of amorphous silicon, for example, a compound semiconductor laser oscillator containing Ga and N and having an oscillation wavelength of 350 nm to 470 nm is used in consideration of the laser stability and the absorption coefficient of the semiconductor film. Further, a semiconductor laser or a solid state laser with the second harmonics of a titanium-saphaire laser, the second harmonics of an Nd:YVO4 laser, the second harmonics of a YAG laser, or the like, or a Kr gas laser or the like as a gas laser is used preferably.

The beam shaper 32 can cut out individual regions of a laser beam having a profile approximate to the Gaussian shape, generated from the light source part 31, with a cylindrical or honeycomb lens, and overlay the cut-out regions to shape the laser beam into a top-hat type predetermined beam shape.

Specifically, the beam shaper 32 has a mirror which reflects the laser beam emitted from the light source part 31, a lens which transforms the laser beam reflected at the mirror into parallel light, a homogenizer and lens which form the parallel light into a top-hat type laser beam, and a mirror which guides the top-hat type laser beam to the diffraction grating of the diffraction grating mask irradiator 33.

Those optical components (which are an optical head) are configured to be compact, and may be formed on a linear drive type slider to be able to move fast at an equal velocity in one axial direction of the substrate 10 as needed. In this case, it is desirable to reduce the load and size of the optical head part by designing the optical head part with optical fibers or the like introduced before the beam combining part except for the case other than using a small-sized semiconductor laser or the like.

The laser beam which is shaped into a top-hat type beam shape by the beam shaper 32 is modulated by the diffraction grating of the diffraction grating mask irradiator 33, yielding a plurality of energy beams whose irradiation points are aligned at given intervals.

Figure 3:
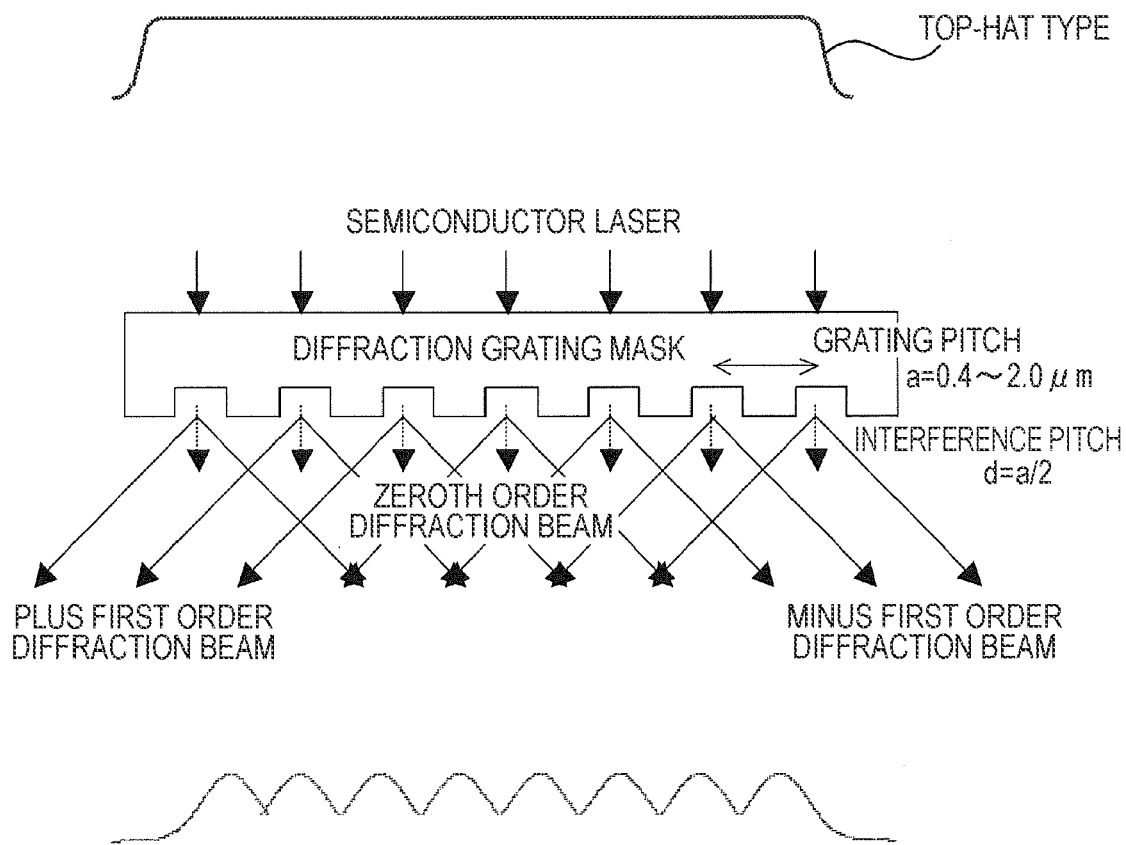
FIG. 3 is an exemplary cross-sectional view illustrating a diffraction grating.

FIG. 3 is an exemplary cross-sectional view illustrating the diffraction grating. The diffraction grating is linear concavoconvexes aligned on one surface of a glass substrate at a predetermined pitch (grating pitch), so that an input semiconductor laser beam is subjected to intensity modulation with an interference pattern. In the embodiment, the grating pitch a is 0.4 to 2.0 μm, for example, and the interference pitch d is a/2.

A top-hat type laser beam is modulated to provide alignment of multiple beam irradiation points (beam spots) with the interference pitch. According to the semiconductor processing apparatus of the embodiment, the multiple beam spots are irradiated onto the substrate in parallel.

When the optical head side is fixed in use, the stage 20 is configured to move in a direction not in parallel to the pitch direction of the diffraction grating. This makes it possible to provide such setting that the maximum intensity point (beam spot) modulated with the diffraction grating crosses the channel portion of the semiconductor device which is designed on the substrate 10 mounted on the stage 20.

In other words, according to the configuration, the substrate 10 is scanned in one direction (e.g., X direction) with the laser beam which forms an image on the substrate 10 while having an intensity distribution.

The overall processing speed can be increased by irradiating a plurality of beam spots on the specified channel region on the substrate 10. It is therefore desirable to provide an observation part which can ensure observation of an alignment mark provided on the substrate 10 at a predetermined position. The observation part can be provided on a part other than the optical head as long as the positional relationship with respect to the optical head is maintained.

The observation part is a part for observing an alignment mark to be a same reference point marked on the top surface of the substrate beforehand. The observation part includes an illumination light source which irradiates illumination light, a shaping part which shapes the illumination light emitted from the illumination light source, an image sensing part which receives reflected light of the illumination light shaped by the shaping part, and a monitor for showing an image sensed by the image sensing part.

A processing unit which includes the stage 20 and the supply section 30 may be increased in quantity within the range where adjustment of the individual processing units is possible. Parallel processing with the individual processing units can improve the throughput further.

<Semiconductor Processing Method>

A semiconductor device, such as a thin film transistor, is fabricated with the semiconductor processing apparatus having the foregoing configuration in the following procedures. First, the light source part 31 of the supply section 30 generates a laser beam or an energy beam, and laser beams having a plurality of irradiation points aligned at given intervals are irradiated on the substrate via the beam shaper 32 and the diffraction grating mask irradiator 33.

To scan the substrate with laser beams with a plurality of irradiation points in this state, the movement of the laser beams relative to the substrate is carried out by driving the stage 20 or driving the optical head. As a result, the semiconductor film 11 on the substrate 10 can be scanned with the laser beams with a plurality of irradiation points aligned at given intervals.

Thereafter, scanning with the laser beams in the X direction is repeatedly executed while moving the substrate 10 on the stage 20 in the Y direction. This makes it possible to execute the process of irradiating laser beams at arbitrary positions on the substrate 10 in the two-dimensional (XY) space.

According to the semiconductor processing apparatus, the substrate 10 mounted on the stage 20 is relatively scanned with the laser beams, making it possible to scan the substrate 10 with the laser beams at a high speed of, for example, over 0.1 m/sec to effect continuous irradiation of the laser beams on the substrate 10. It is also possible to execute annealing to reduce the thermal load on the substrate 10 by controlling the moving speed of the laser beams with respect to the substrate 10 and the amount of energy of the laser beams.

As a result, annealing with the thermal load on the substrate 10 reduced can be carried out by adjusting the moving speed of the laser beams fast or reducing the amount of energy. For example, it is possible to use a plastic substrate or the like with a lower heat resistance in the annealing process for crystallizing the semiconductor film on the substrate 10. This makes it possible to realize a mass-production process with a suppressed equipment cost in the roll-to-roll based equipment using a flexible substrate in the fabrication process for a thin film semiconductor device, for example.

There is a case where an electrode pattern or the like is formed on the substrate 10 where the laser beams are irradiated or where the substrate is rolling significantly. When there is not a mechanism of normally optimizing the focus of the laser beams, therefore, irradiation needs to be carried out with a laser having a considerable focus depth. In case of using a laser objective lens with a high convergency, it is possible to previously monitor an irradiation area with a device having a focus servo function and control the annealing laser beam in such a way as to be at an optimal focus position when the laser beam comes to the looked-ahead area.

<Direction of Alignment of Irradiation Points of Energy Beams>

Figure 4:
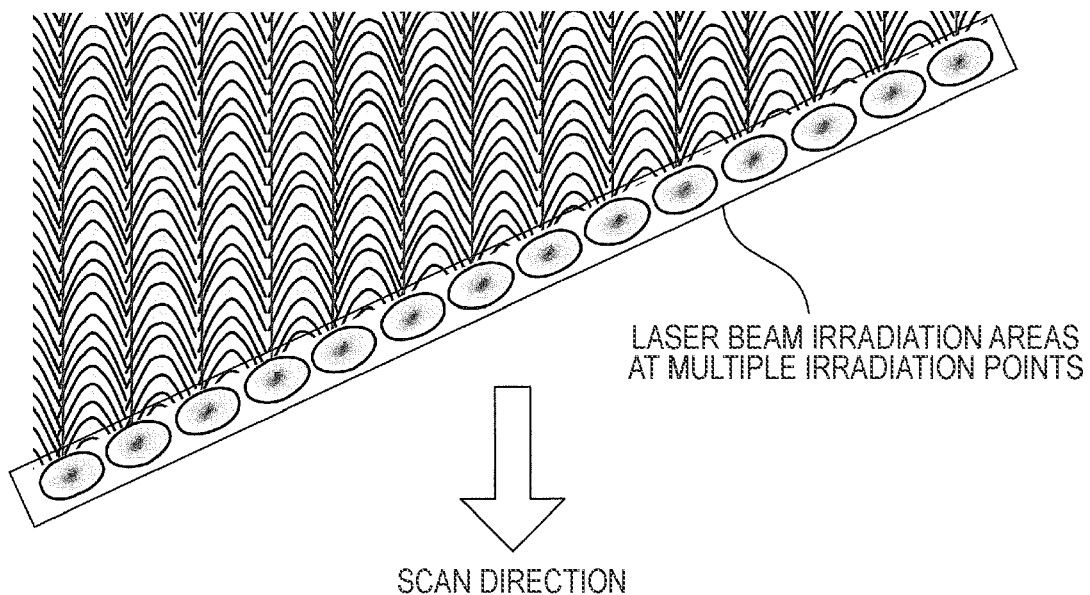
FIG. 4 is an exemplary diagram illustrating the direction of alignment of the irradiation points of energy beams.

FIG. 4 is an exemplary diagram illustrating the direction of alignment of the irradiation points of energy beams. According to the embodiment, in irradiating energy beams with a plurality of irradiation points aligned at given intervals on a substrate, the direction of alignment of the plurality of irradiation points is tilted with respect to the scan direction. In the example shown in FIG. 4, the area surrounded by a rectangular frame in the diagram is the laser beam irradiation area formed by a plurality of irradiation points, and the arrow in the diagram shows the scan direction. As the direction of alignment of a plurality of irradiation points is tilted with respect to the scan direction, there is a time lag between the timings at which beam spots hit scanning rows at the respective irradiation points, making it possible to adequately form crescent-shaped crystal grains as shown in FIG. 4.

Here, the crystal grains are formed as follows. When the irradiation point (beam spot) of the laser beam is irradiated on the semiconductor film, a part of the semiconductor film or the entire semiconductor film is completely melted with the heat energy. As the semiconductor film is scanned with the beam spot, therefore, solidification progresses with the passing of the laser beam in the scan path of completely melting the semiconductor film, forming a line of crystal grains along the scan center of the laser beam.

At this time, the laser beam is made to have, for example, a Gaussian-shaped profile having a distribution with a high center portion and a lower peripheral portion, the temperature of the irradiation portion of the laser beam corresponds to the Gaussian-shaped profile of the laser beam profile (Beam Profile), and becomes highest in the scan center of the laser beam and lowest at both ends thereof. As a laser beam is irradiated while scanning therewith is carried out in the scan direction, crystal solidification starts from positions apart from the scan center (both ends of the scan path of the laser beam) in the scan path of completely melting the semiconductor film, producing a given number of crystal seeds at both ends of the scan path.

As the scanning with the laser beam progresses further, solidification progresses in the scan direction toward the scan center with the crystal seeds pulled toward the scan center in the scan direction, and the crystal in the scan center is crystallized last.

At this time, the scan speed and output of the laser beam may be adjusted within the range of the foregoing irradiation conditions so that rendezvous of solidification occurs in the scan center. This provides hemicrescent-shaped crystal grains which extend toward both end sides of the scan path from the scan center, i.e., crystal grains which have a shape obtained by bisecting a crescent at a line-symmetrical line.

Because scanning with a plurality of irradiation points aligned at given intervals is carried out in parallel in the embodiment, tilting the direction of alignment of the irradiation points with respect to the scan direction allows melting and solidification to be carried out continuously with a time lag for each scan path of adjacent irradiation points, thus forming the crescent-shaped crystal grains.

Figure 5:
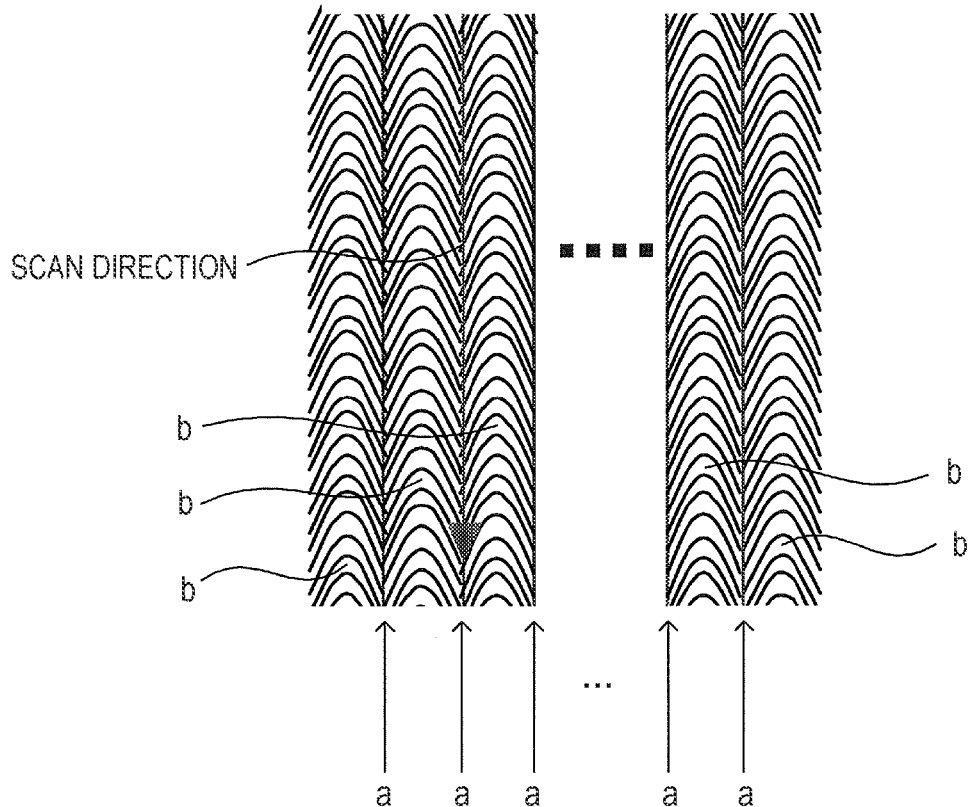
FIG. 5 is an exemplary diagram showing the state of a crystal after laser annealing.

FIG. 5 is an exemplary diagram showing the state of a crystal after laser annealing. According to the embodiment, the laser beam is interfered with the diffraction grating for intensity modulation to thereby form a plurality of irradiation points, so that grain boundaries a corresponding to the number, n, of interference points (beam spots) in association with the interference points. In addition, crescent-shaped crystal grains b are formed between adjacent interference points or between the grain boundaries a.

In case of forming a thin film transistor, therefore, the intervals of a plurality of irradiation points, the scan speed thereof and the amount of energy thereof are controlled in such a way that grain boundaries a are periodically provided in the region of the semiconductor film which becomes the channel portion of the thin film transistor in the direction of the channel length. Accordingly, a plurality of the grain boundaries a are formed in the channel portion to ensure the uniform characteristic of the thin film transistor over the range where the carrier mobility is maintained. Specifically, it is desirable to set the conditions in such a way that several tens of (e.g., fifty or so) grain boundaries a in the direction of the channel length.

<Regarding Beam Spot>

Figure 6:
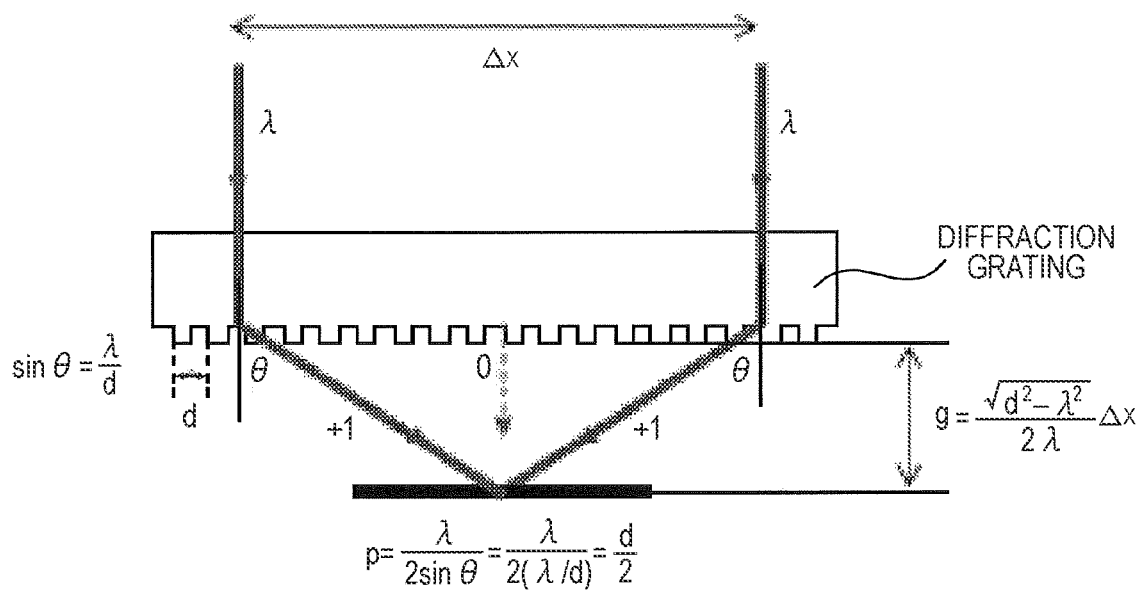
FIG. 6 is an exemplary diagram illustrating the beam spot size of a laser beam formed by the diffraction grating.

The beam spot of a laser beam which is to be emphasized by the diffraction grating is described below. FIG. 6 is an exemplary diagram illustrating the beam spot size of a laser beam formed by the diffraction grating. In the diagram, $\Delta x$ is the width of the laser beam incidental to the diffraction grating, $\lambda$ is the wavelength of the laser beam, and d is the pitch of the diffraction grating. In this case, a distance g for the laser beam to be converged by the diffraction grating is given by $$g = \{\sqrt{(d^2-\lambda^2)}/2\lambda\} \cdot \Delta x.$$

Given that $\theta$ is the angle of the laser beam perpendicularly incident to the diffraction grating when the laser beam is diffracted and output, the pitch P of the appeared interference pattern emphasized by the diffraction grating is given by $$P = \lambda/2 \sin \theta = \lambda/2(\lambda/d) = d/2.$$

Figure 7:
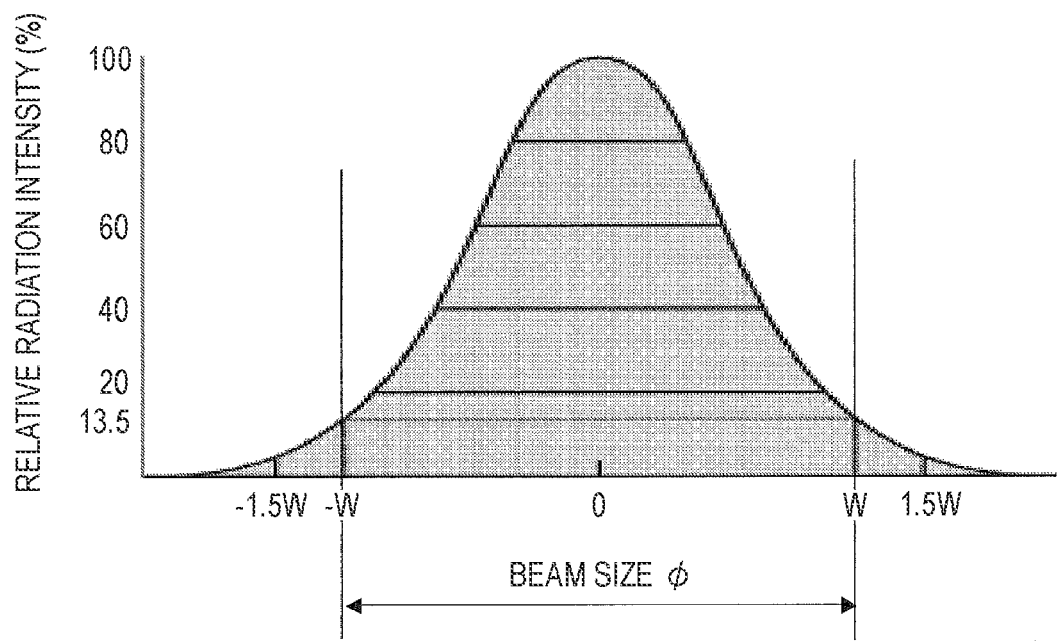
FIG. 7 is a diagram showing a beam profile based on the relative radiation intensity of a beam.

The beam spot of the laser beam formed by the diffraction grating has a beam profile approximated to a Gaussian-shaped profile. FIG. 7 is a diagram showing a beam profile based on the relative radiation intensity of a beam. In general, for a beam spot having the profile of the relative radiation intensity approximated to a Gaussian-shaped profile, the size of the beam spot at the position where the peak value of the relative radiation intensity becomes $1/e^2$ (e is the base of the natural logarithm) or 13.5% is defined as a beam size $\phi$.

Figure 8:
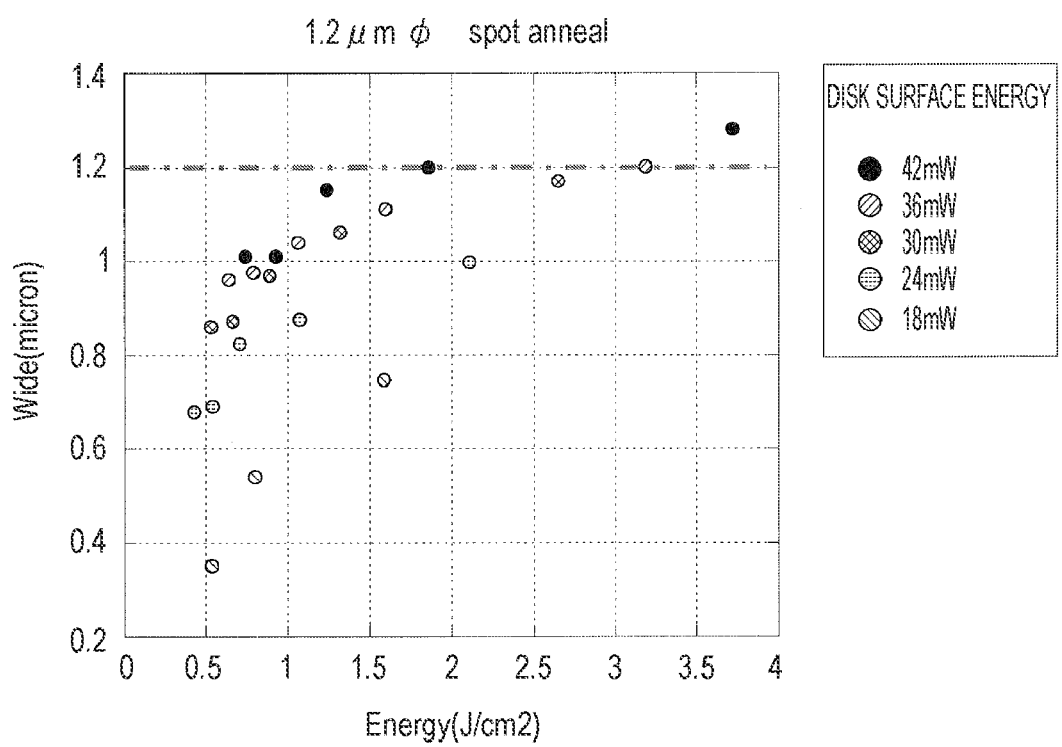
FIG. 8 is a diagram showing the relation between the beam energy and crystal grains when a semiconductor film is subjected to a heat treatment with a beam size of 1.2 µm.

FIG. 8 is a diagram showing the relation between the beam energy and crystal grains when a semiconductor film is subjected to a heat treatment with a beam size $\phi$ of 1.2 µm as defined above. As apparent from the diagram, the size of crystal grains formed by the heat treatment on a semiconductor film with irradiation of a laser beam is substantially less than the beam spot size. According to the embodiment, this property is used to set the interval between, for example, the diffraction grating and the substrate, and the amount of energy so that the beam spots of a plurality of laser beams have a Gaussian shape, thereby adequately controlling the size of the crystal grains formed.

Figure 9A:
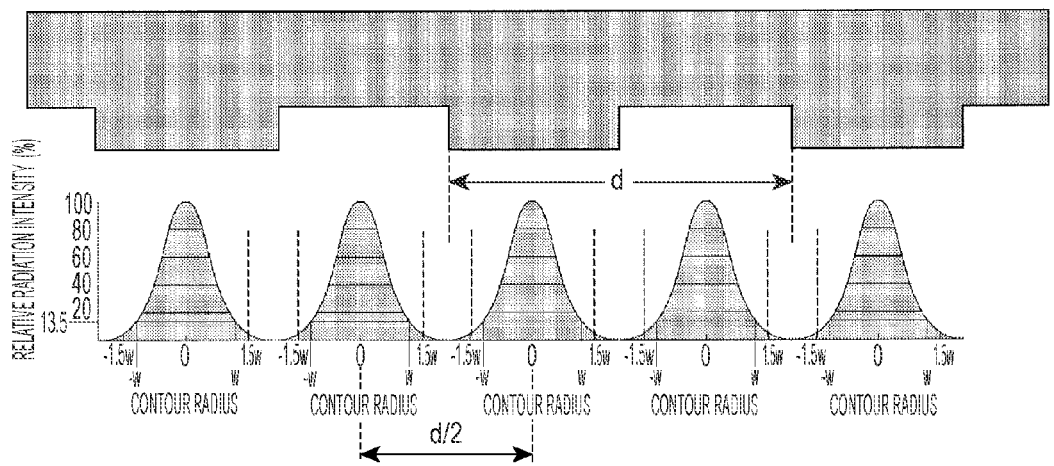
FIGS. 9A to 9C are exemplary diagrams showing the beam profile of a laser beam formed by the diffraction grating.
Figure 9B:
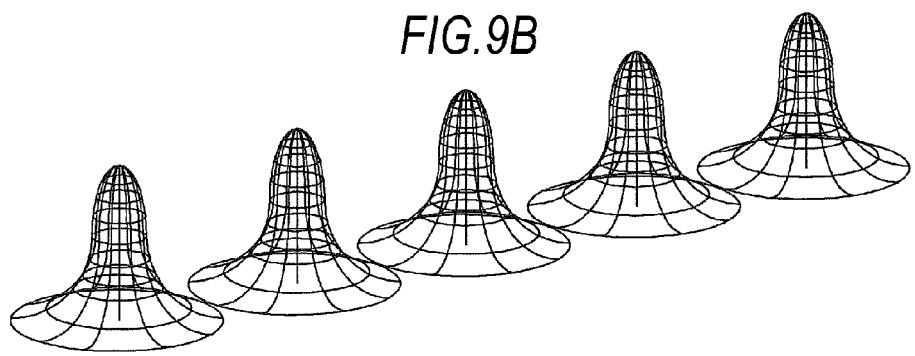
Figure 9C:
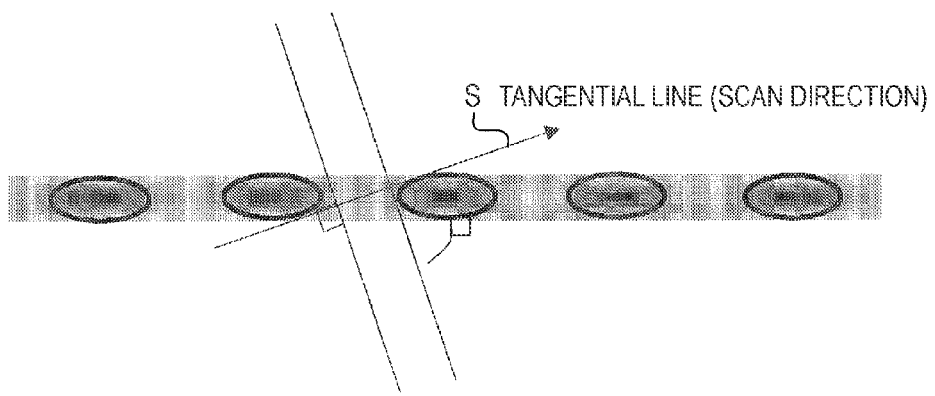

FIGS. 9A to 9C are exemplary diagrams showing the beam profile of a laser beam formed by the diffraction grating. As shown in FIG. 9A, the pitch of a plurality of laser beams formed by the diffraction grating becomes d/2 where d is the pitch of the diffraction grating.

The above-described distance of the diffraction grating diffraction grating and the substrate causes the beam profile of each laser beam to be approximated to a Gaussian-shaped profile. According to the embodiment, as shown in FIG. 9B, beams are formed in such a way that the beam profile of a plurality of laser beams formed by the diffraction grating is approximated to such a profile that the cross section at any angle of rotation about the axis penetrating the peak value of the relative radiation intensity is approximated to a Gaussian shape.

That is, according to the embodiment, at the time of irradiating laser beams with a plurality of irradiation points (beam spots) aligned at given intervals on a substrate, the direction of alignment of a plurality of beam spots is tilted with respect to the scan direction. As each beam spot moves on the scan path along the scan direction at this time, the energy distribution on the scan path becomes equivalent to the cross-sectional shape of the beam profile along a direction perpendicular to the scan direction.

Therefore, as beams are formed to have a beam profile which is approximated to such a profile that the cross section at any angle of rotation about the axis penetrating the peak value of the beam profile is approximated to a Gaussian shape, it is possible to normally obtain a beam profile approximated to a constant Gaussian-shaped profile on the scan path even if a predetermined angle is formed between the direction of alignment of beam spots and the scan direction. That is, the peak position of the beam profile on the scan path becomes linear along the scan path, so that the distribution of heat energy on the scan path can be made constant.

As shown in FIG. 9C, at the time of irradiating laser beams with beam spots aligned at given intervals and carrying out scanning with the laser beams, a tangent line S which is tangential to two adjacent beam spots on the right and left sides respectively is assumed so as not to produce a gap between the beam spots where a laser beam is not irradiated. The angle θ between the direction of alignment of beam spots and the scan direction (tangent line S) is set in such a way that the tangent line S is in the scan direction.

Figure 10:
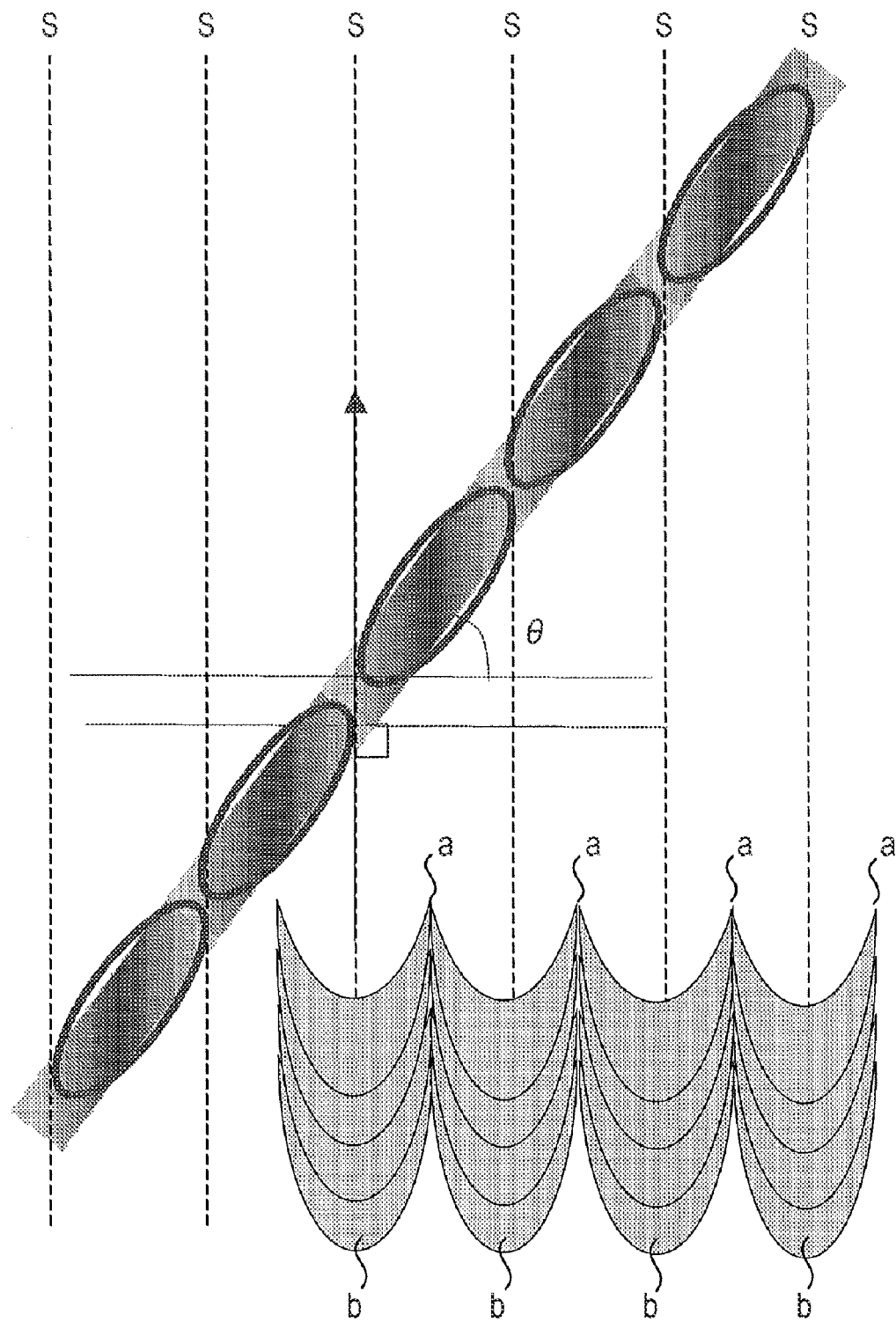
FIG. 10 is an exemplary diagram illustrating an angle between alignment of beam spots and the scan direction.

FIG. 10 is an exemplary diagram illustrating an angle between alignment of beam spots and the scan direction. On the assumption of a tangent line S which is tangential to two adjacent beam spots on the right and left sides respectively and is in the scan direction, as mentioned above, the direction of alignment of beam spots is tilted by θ with respect to the scan direction.

This prevents a gap where a laser beam is not irradiated from being produced in the scan path formed by the beam spots, making it possible to irradiate the entire laser-beam irradiation area with the laser beam to perform a heat treatment thereon. The tilting of the direction of alignment of beam spots produces a time lag between irradiation positions along the scan direction of the beam spots, making it possible to form crescent-shaped crystal grains b and grain boundaries a.

<Method of Dividing Energy Beam>

FIGS. 11A and 11B and FIGS. 12A and 12B are exemplary diagrams for explaining methods of dividing a laser beam as an energy beam. Although the foregoing description has given an example of using one diffraction grating as a method of dividing a laser beam having irradiation points aligned at given intervals, the division of a laser beam can be achieved by other methods.

Figure 11A:
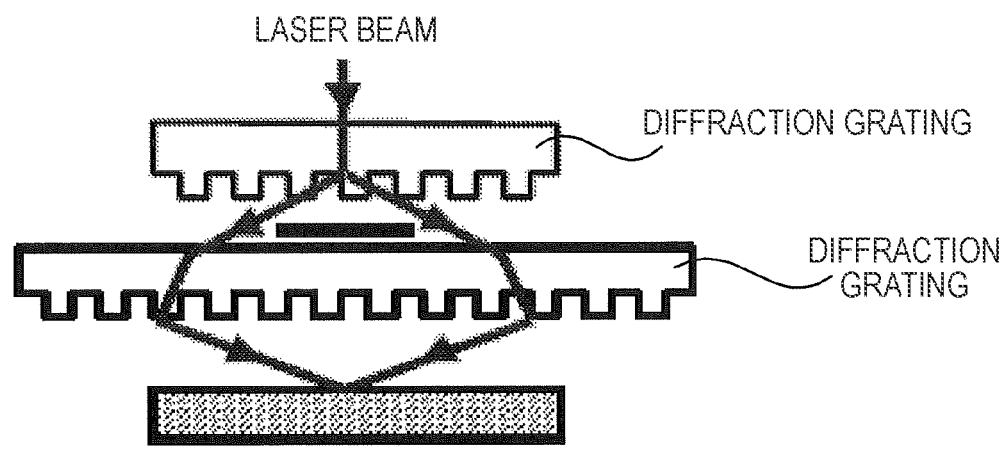
FIGS. 11A and 11B are exemplary diagrams for explaining methods of dividing a laser beam as an energy beam.
Figure 11B:
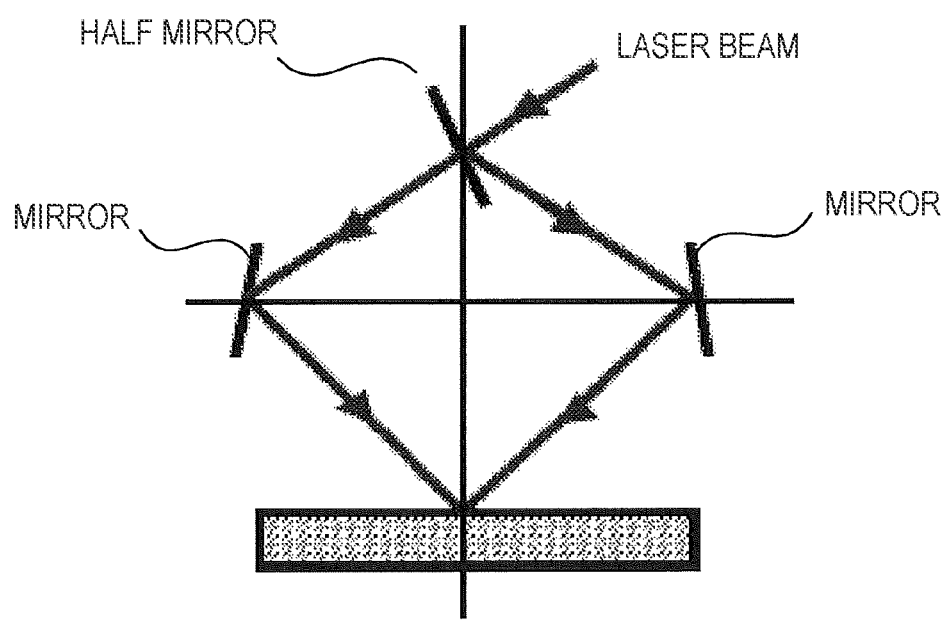

The example shown in FIG. 11A utilizes multiple beam interference caused by overlapping two diffraction gratings. In the example shown in FIG. 11B, a laser beam is branched into two optical paths by a half mirror and beam interference is caused by light rays of the two optical paths.

Figure 12A:
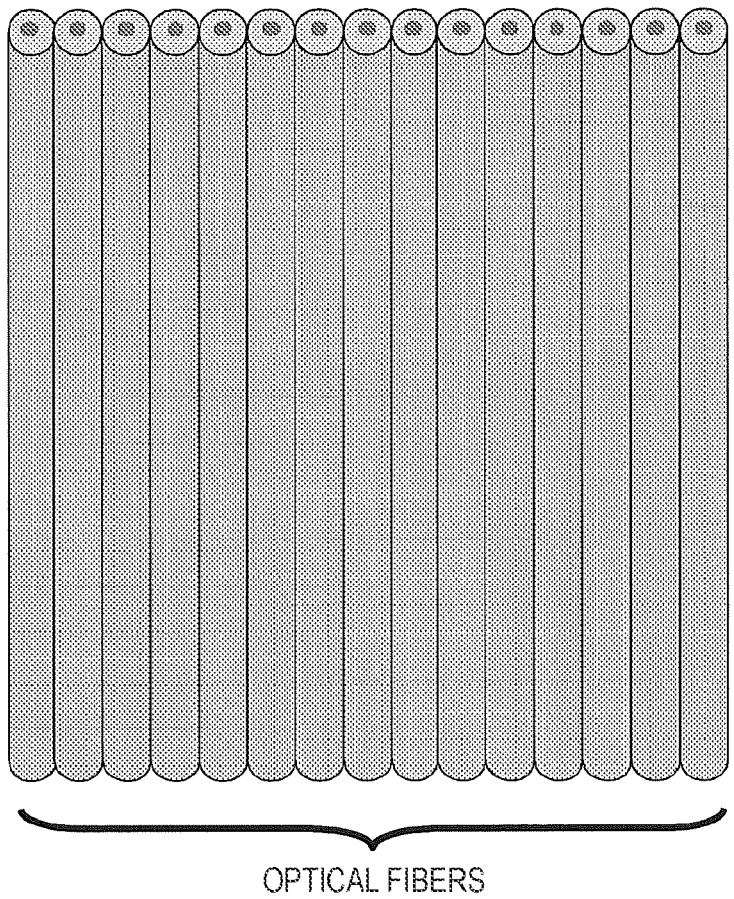
FIGS. 12A and 12B are exemplary diagrams for explaining methods of dividing a laser beam as an energy beam.
Figure 12B:
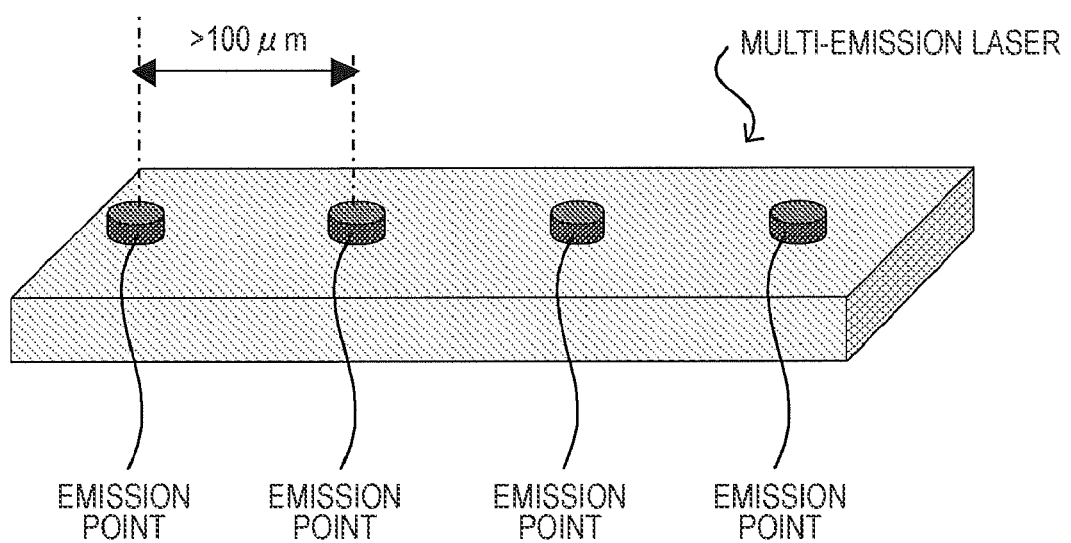

The example shown in FIG. 12A has a plurality of optical fibers arranged linearly, so that laser beams are input to the individual optical fibers which output the laser beams from their end faces. This makes it possible to set the intervals of the beam spots based on the pitch of the optical fibers. The example shown in FIG. 12B uses a multiemission laser. The multiemission laser is a laser device which has a plurality of emission points formed on a single substrate. Accordingly, laser beams are emitted from multiple points according to the pitch set at the time of fabrication, and are irradiated on the substrate.

In any of the examples, the laser beam and the substrate are moved relative to each other in a direction which not in parallel to the alignment of a plurality of irradiation points of the laser beam. The case where a predetermined angle is provided between the alignment of a plurality of irradiation points and the scan direction can be coped with rotating the optical unit having the aforementioned dividing units or the stage on which the substrate is mounted.

<Improvement on Throughput>

Figure 13:
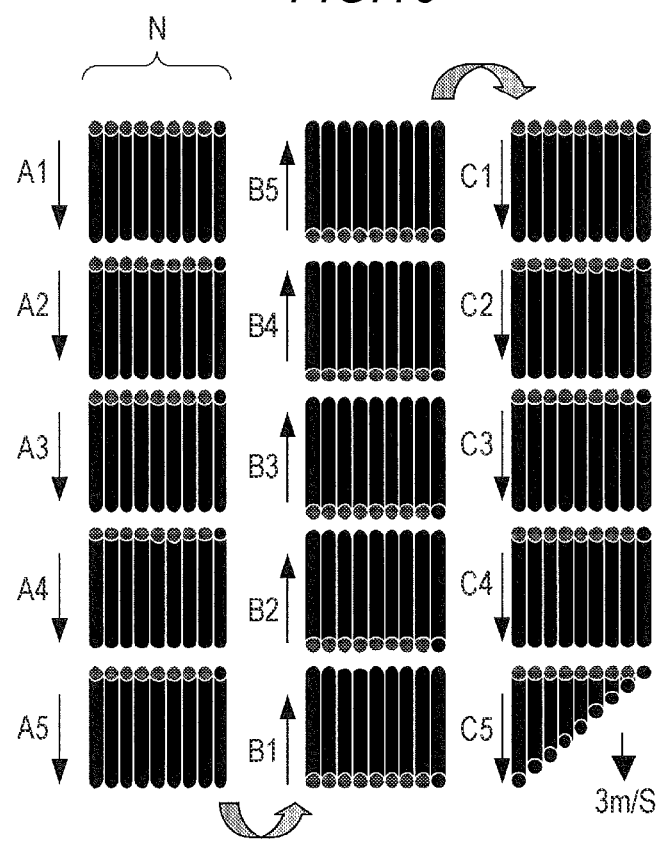
FIG. 13 is an exemplary diagram illustrating the scan direction in irradiation of laser beams according to the embodiment.

FIG. 13 is an exemplary diagram illustrating the scan direction in irradiation of laser beams according to the embodiment. In case where a single scan path row N is formed by the alignment of a plurality of laser beams, first, scanning is carried out in the order of arrows A1, A2, A3, A4 and A5 in this embodiment.

Next, in scanning the next row, the scanning direction is turned back from the arrow A5, and then scanning is carried out in the opposite direction to the previous scan direction in the order of arrows B1, B2, B3, B4 and B5. Further, in scanning the next row, the scanning direction is turned back from the arrow B5, and then scanning is carried out in the opposite direction to the previous scan direction in the order of arrows C1, C2, C3, C4 and C5.

As apparent from the above, when scanning of one row is completed, the scanning direction is turned back in the opposite direction for a next row to carry out scanning in order. It is not therefore necessary to return to the same position for each scan row, minimizing the moving distance of the optical head or the stage. This can improve the throughput at the time of scanning.

Figure 14:
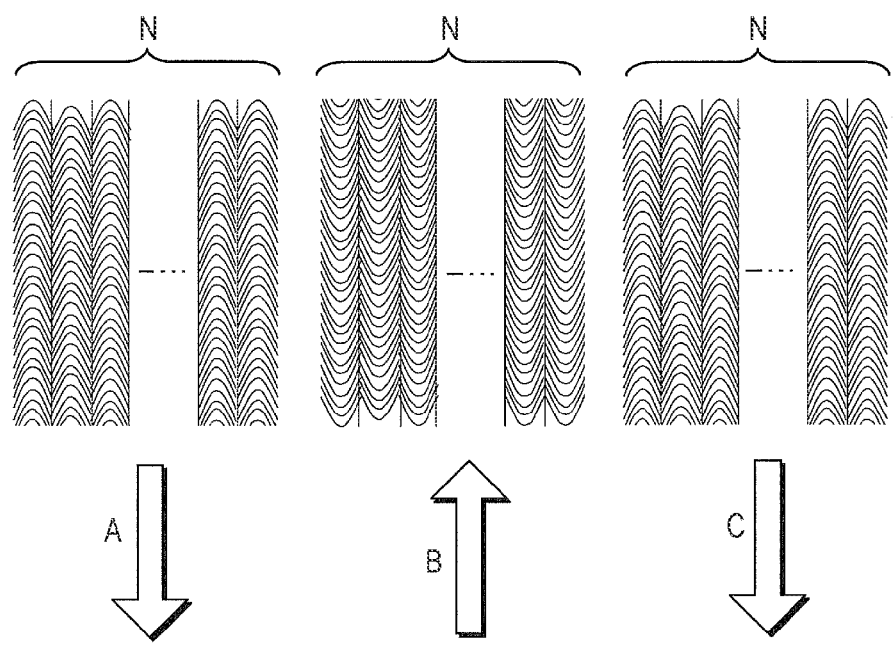
FIG. 14 is an exemplary diagram showing the state of crystal grains in case of effecting turn-back scan.

FIG. 14 is an exemplary diagram showing the state of crystal grains in case of effecting turn-back scan. In scanning a single scan path row N, the scan direction in the direction of the arrow A is opposite to the scan direction in the direction of the arrow B, so that the direction of the crescent-shaped crystal grains is reversed. Further, the scan direction in the direction of the arrow B is opposite to the scan direction in the direction of the arrow C, so that the direction of the crescent-shaped crystal grains is reversed. As apparent from the above, the direction of the crescent-shaped crystal grains is alternately reversed according to the scan direction.

<Fabrication Method for Thin Film Semiconductor Device>

The following describes a fabrication method for a thin film semiconductor device, which is carried out following the above-described crystallization method. A fabrication method for a semiconductor device which has a plurality of thin film transistors TFT provided on the same substrate is described below. The associated diagrams mainly show only a single thin film transistor forming portion.

Figure 15A:
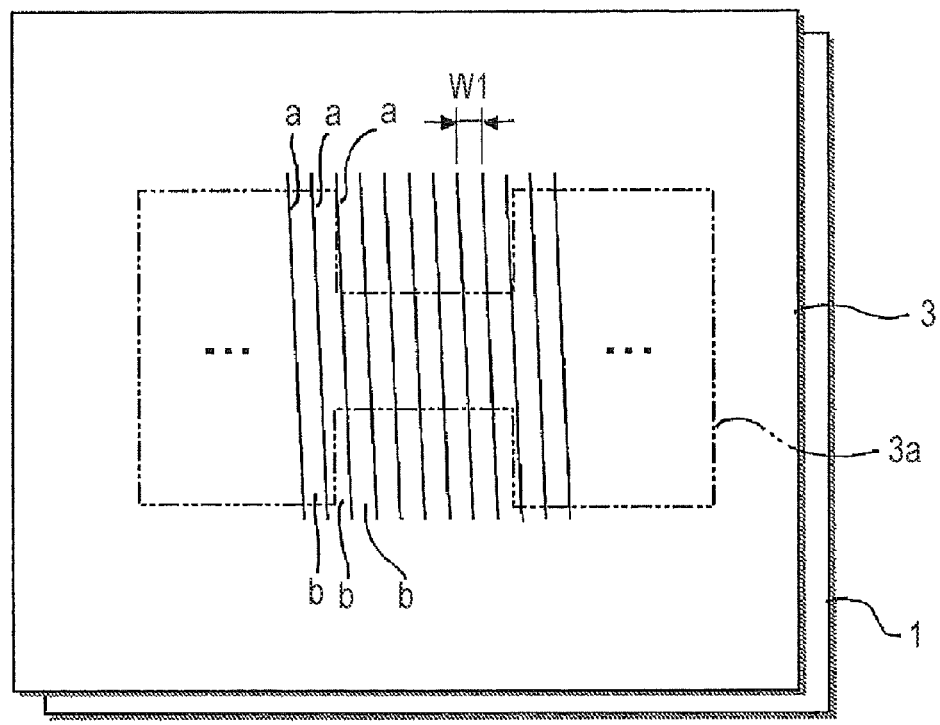
FIGS. 15A and 15B are diagrams (part 1) illustrating a fabrication method for a semiconductor film semiconductor device.

First, as shown in FIG. 15A, the entirety of each active region 3a set on a semiconductor film 3 on a substrate 1 is selectively crystallized by the above-described crystallization method. Then, band-line crystal grains b are formed in each active region 3a in such a way as to cross the active region 3a. Accordingly, grain boundaries a with a width W1 (=several hundred nm) therebetween are periodically aligned in such a way as to cross the active region 3a. At this time, the length of the belt-like crystal grains b is set to several μm to several hundred μm or so in conformity with the standards for thin film transistors.

Figure 15B:
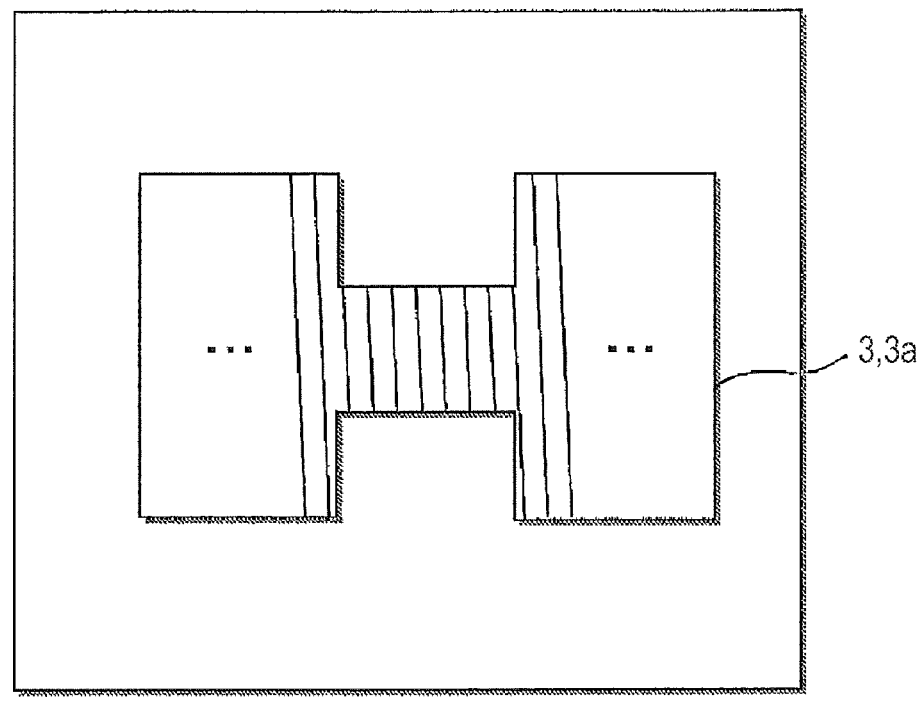

Next, as shown in FIG. 15B, the semiconductor film 3 is patterned and etched in a predetermined pattern to leave the crystallized active regions 3a, and each active region 3a is divided into islands of a predetermined shape for device isolation.

In this case, as illustrated, the semiconductor film 3 may be patterned and etched so that the semiconductor film 3 portion which is not crystallized does not remain around the active region 3a. Alternatively, the semiconductor film 3 may be patterned and etched so that the semiconductor film 3 portion which is not crystallized remains around the active region 3a. In this case, the entire crystallized region in the island-patterned region becomes the active region, while an amorphous region remaining therearound becomes an isolation region.

Such patterned etching of the semiconductor film 3 may be carried out before the crystallization process. In this case, the crystallization process is performed on each island-patterned semiconductor film 3 including a region reserved for the active region 3a.

Next, a gate insulating film (not shown) is formed on an upper portion of the substrate 1, with the patterned active region 3a covered. This gate insulating film may be formed of silicon oxide or silicon nitride, and can be formed by ordinary PE-CVD (Plasma-Enhanced Chemical Vapor Deposition) known, as well as known SOG (Spin on Glass) which forms an applied insulating film. The formation of the gate insulating film may be carried out before the patterned etching of the semiconductor film 3.

Figure 16:
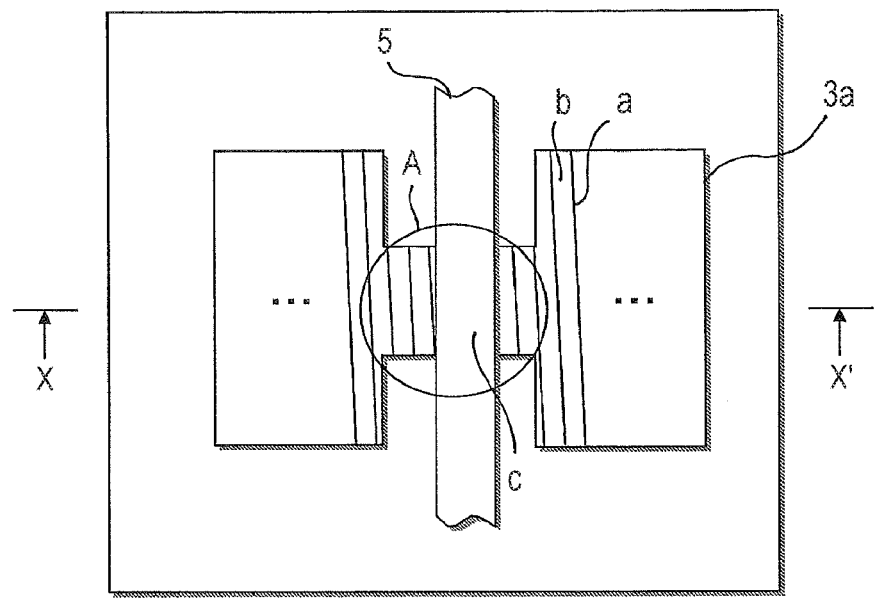
FIG. 16 is a diagram (part 2) illustrating the fabrication method for a semiconductor film semiconductor device.
Figure 17:
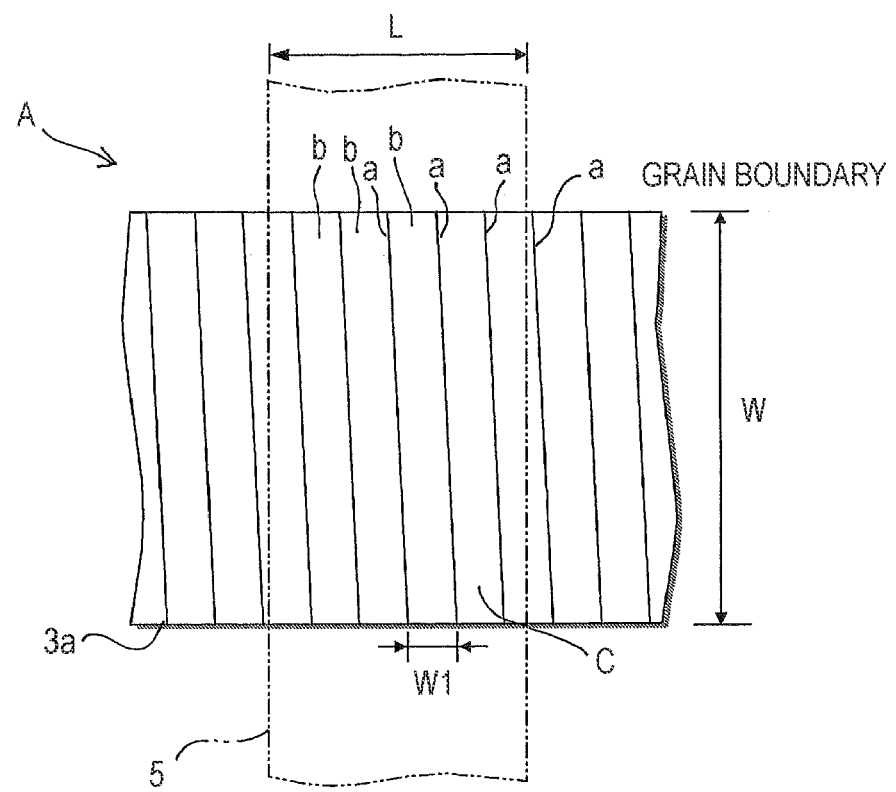
FIG. 17 is a diagram (part 3) illustrating the fabrication method for a semiconductor film semiconductor device.

Next, as shown in FIG. 16, a gate electrode 5 with a shape to cross the center portion of each island-divided active region 3a is formed on the gate insulating film. It is important to form the gate electrode 5 along the extending direction of the grain boundaries a (the extending direction of the belt-like crystal grains b). FIG. 17 shows in enlargement the part A in FIG. 16.

As shown in those diagrams, the gate electrode 5 is provided so as to cross that portion of the active region 3a which is designed to have a predetermined width W, the width of the active region 3a where the gate electrode 5 crosses becomes the channel width W. That is, the grain boundaries a are provided in such a way as to cross the channel portion C under the gate electrode 5 in the direction of the channel width W.

It is assumed that the line width of the gate electrode 5 (which corresponds to the channel length L) is designed based on the standards for the thin film transistors to be fabricated here, and a predetermined number of grain boundaries a are arranged so as to cross the channel portion C in the direction of the channel width W. For thin film transistors with the same characteristics, it is important to provide approximately the same number of grain boundaries a at the channel portion C. The "approximately the same number" is preferably in a range of plus or minus one to a predetermined number.

The less a variation in the actual number of the grain boundaries a to be provided at the channel portion C with respect to a predetermined number, the more uniform a variation in the characteristics of thin film transistors can be made. It is therefore desirable that the number of the grain boundaries a to be provided at the channel portion C be two or more, and it is better to set the number larger.

Specifically, as will be described in the later description of the embodiment, it is preferable to set the width, W1, of the crystal grains b (i.e., the pitch of the grain boundaries) according to the channel length L in such a way that 25 or so grain boundaries a extending in the direction of the channel width W are provided at the channel portion C.

It is to be noted however that the greater the grain boundaries a at the channel portion C which cross the direction of the channel length L, the lower the carrier mobility in the direction of the channel length L, so that it is better to set the number of the grain boundaries a as large as possible within the range where the carrier mobility is kept to a certain high level.

Figure 18:
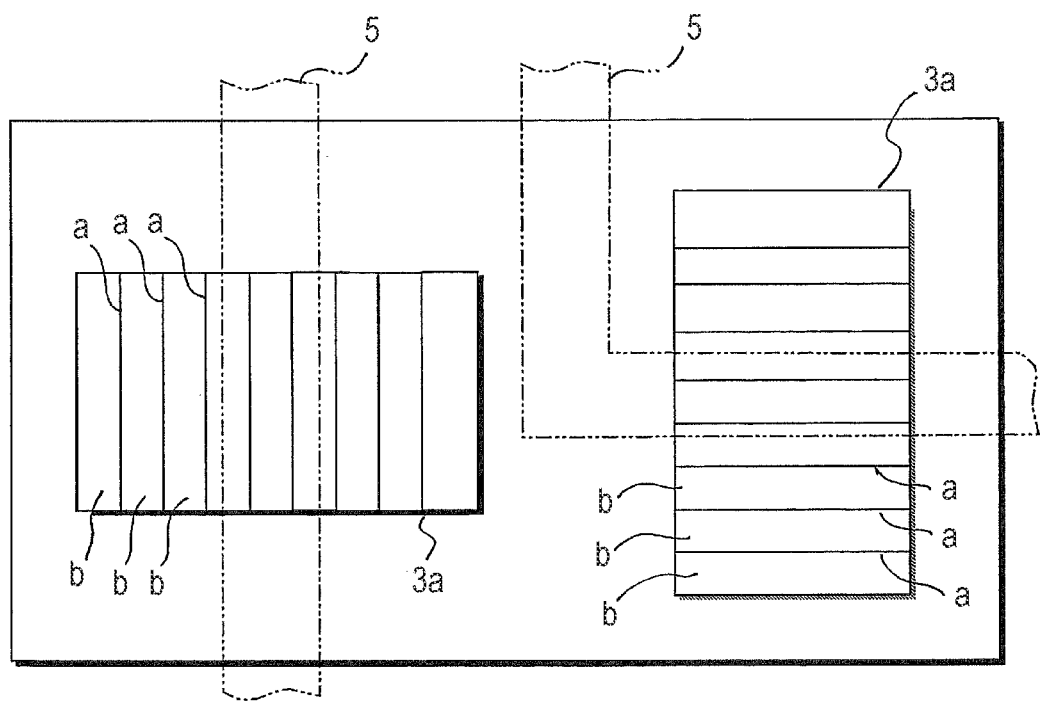
FIG. 18 is a diagram (part 4) illustrating the fabrication method for a semiconductor film semiconductor device.

In addition, it is important to form the gate electrode 5 in a predetermined state with respect to the grain boundaries a provided at each active region 3a as mentioned above. In the previous crystallization process, therefore, as shown in FIG. 18, the scan direction of a laser beam in each active region 3a is set according to the layout direction of the gate electrode 5, so that the extending directions of the belt-like crystal grains b and the grain boundaries a match with the layout direction of the gate electrode 5.

At the time of forming the gate electrode 5, first, an electrode material layer of, for example, aluminum is deposited by sputtering or vapor deposition, and then a resist pattern is formed on the electrode material layer by lithography. Thereafter, with the resist pattern used as a mask, the electrode material layer is etched to pattern the gate electrode 5.

The formation of the gate electrode 5 is not limited to such procedures, and may be carried out by a scheme of applying and printing, for example, fine metal particles. In etching the electrode material layer at the time of forming the gate electrode 5, the gate insulating film may be etched subsequently.

Figure 19:
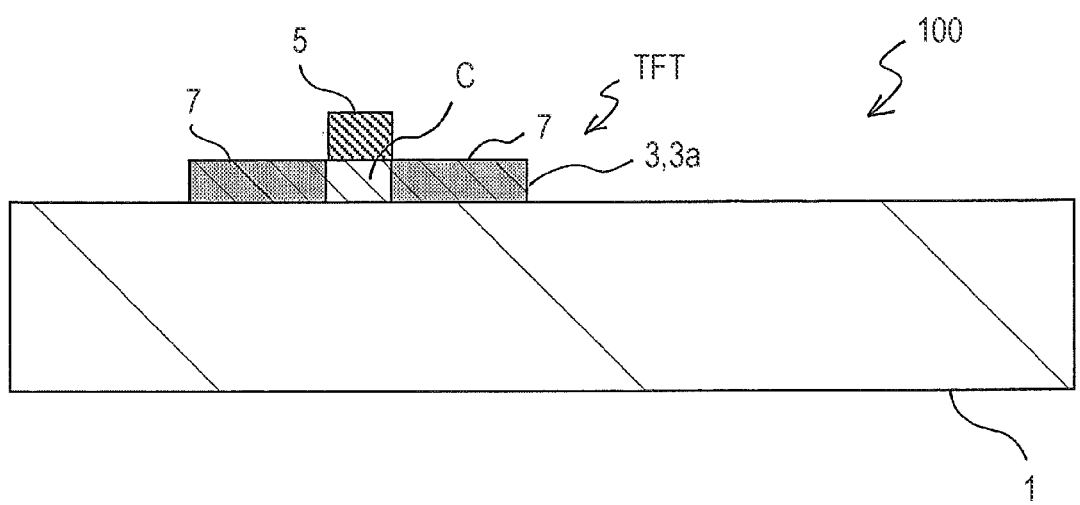
FIG. 19 is a diagram (part 5) illustrating the fabrication method for a semiconductor film semiconductor device.

Next, as shown in the cross-sectional view of FIG. 19, a source/drain 7 having an impurity implanted into the active region 3a in a self-aligned manner is formed by ion implantation with the gate electrode 5 used as a mask and the subsequent annealing process. The cross section in FIG. 19 corresponds to the cross section along direction X-X' in FIG. 16.

As a result, the channel portion C is formed by an impurity-free portion in the crystallized active region 3a under the gate electrode 5. The source/drain 7 and the channel portion C under the gate electrode 5 are formed of polycrystalline silicon yielded by crystallizing the semiconductor film 3, thus yielding a thin film semiconductor device 100 in which a plurality of top-gate type thin film transistors TFT (i.e., polysilicon TFT) using a polysilicon thin film are provided on the same substrate 1.

In case of preparing a liquid crystal display device, for example, as a display device using such thin film transistors TFT as switching elements, the following processes are performed.

Figure 20A:
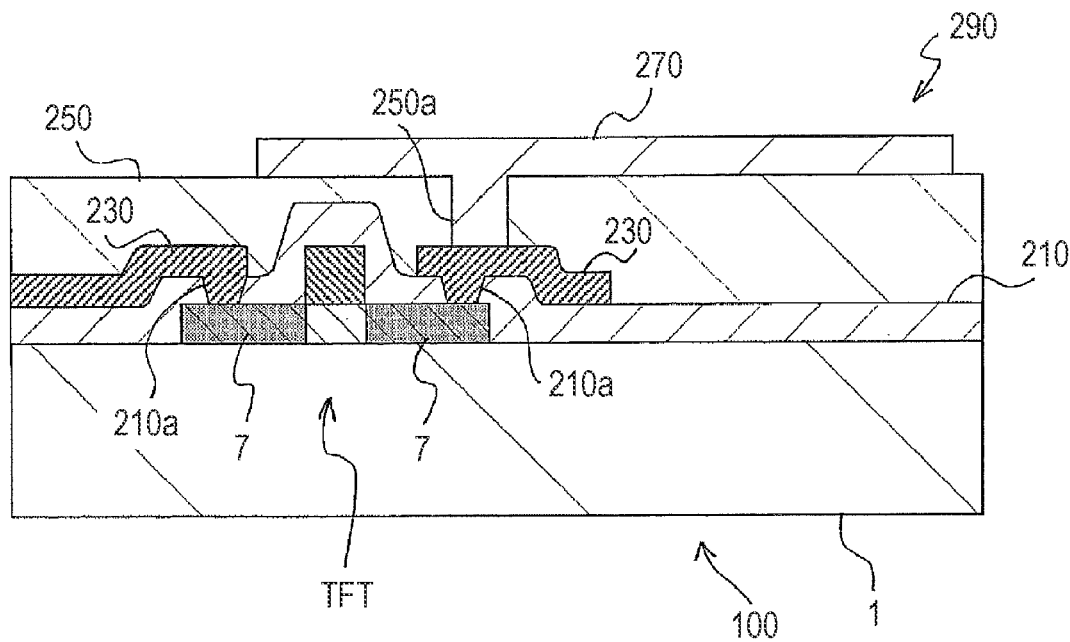
FIGS. 20A to 20B are diagrams (part 6) illustrating a fabrication method for a semiconductor film semiconductor device.

First, as shown in FIG. 20A, an interlayer insulating film 210 is formed on the substrate 1 of the thin film semiconductor device 100, covering the thin film transistor TFT. Next, contact holes 210a which reach the source/drain 7 of the thin film transistor TFT are formed in the interlayer insulating film 210. Then, wirings 230 connected to the source/drain 7 via the contact holes 210a are formed on the interlayer insulating film 210.

Next, a planarized insulating film 250 is formed, covering the wirings 230, contact holes 250a which reach the wirings 230 are formed in the planarized insulating film 250. Next, a pixel electrode 270 connected to the source/drain 7 via the wirings 230 is formed on the planarized insulating film 250. The pixel electrode 270 is formed as a transparent electrode or a reflection electrode depending on the display type of the liquid crystal display device. FIG. 20A shows the cross section of the essential part of one pixel.

Thereafter, though not illustrated, an alignment film covering the pixel electrode 270 is formed on the planarized insulating film 250, thus completing a drive substrate 290.

Figure 20B:
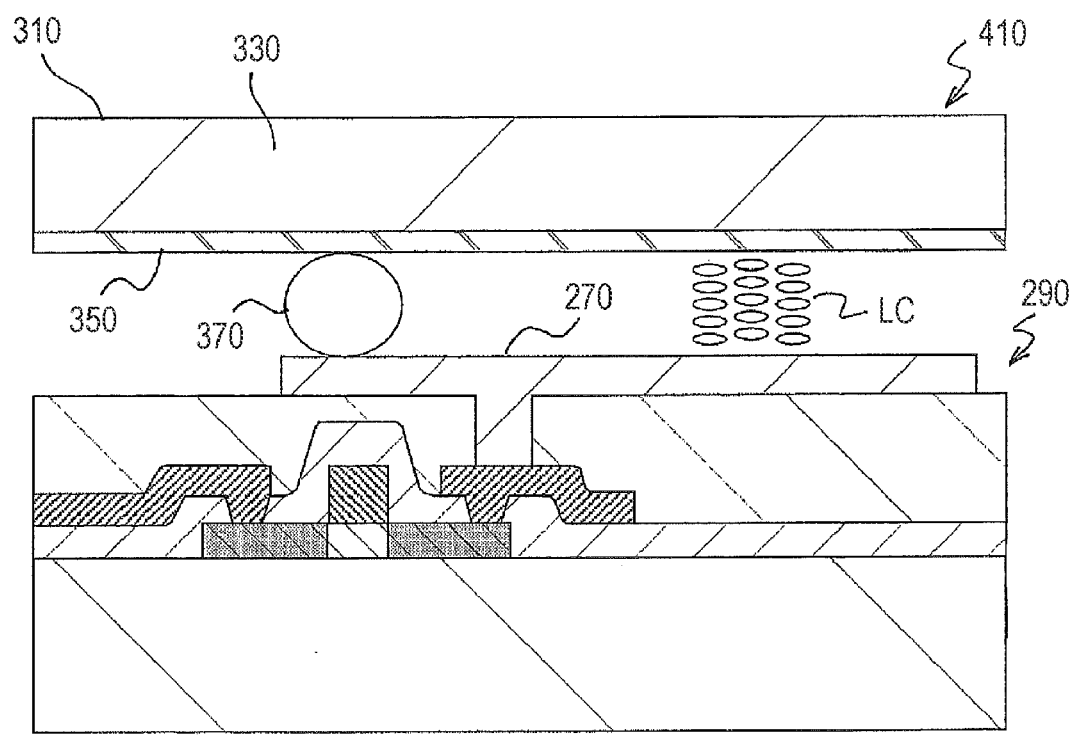

Meanwhile, as shown in FIG. 20B, an opposing substrate 310 to be disposed opposite to the drive substrate 290 is prepared. The opposing substrate 310 has a common electrode 350 provided on a transparent substrate 330 and covered with an alignment film (not shown). The common electrode 350 is formed by a transparent electrode.

With the drive substrate 290 and the opposing substrate 310 are disposed opposite to each other via a spacer 370 with the pixel electrode 270 and the common electrode 350 facing each other. Then, a liquid crystal phase LC is filled and sealed between the substrates 290 and 310 separated at a predetermined clearance from each other via the spacer 370, thus completing a liquid crystal display 410.

In case of preparing an organic EL display device using the drive substrate 290 with the foregoing structure, the pixel electrode provided at the drive substrate 290 is set as a anode (or cathode), an organic layer having necessary functions, such as those of a hole injection layer, an emission layer and an electron transport layer, is laminated on the pixel electrode, and a common electrode is formed as a cathode (or anode) on the organic layer.

Referring to FIGS. 16 and 17, the thin film semiconductor device 100 acquired by using the crystallization method according to the embodiment described above is configured to have the grain boundaries a extending along the gate electrode 5, crossing the channel portion C, and periodically arranged in the direction of the channel length. Accordingly, the carriers which pass through the channel portion C always move crossing the grain boundaries a arranged at the predetermined width W1 therebetween.

It is therefore possible to accurately control the transistor characteristic (carrier mobility) of the thin film transistor TFT in the thin film semiconductor device 100 by controlling the width (i.e., the width W1 of the belt-like crystal grains b). In other words, a variation in carrier mobility in a plurality of devices is suppressed by making the width W1 of the belt-like crystal grains b and the number of the belt-like crystal grains b arranged in the channel portion C (i.e., the number of the grain boundaries a) in one device equal to those of another device.

Moreover, the crystal state between grain boundaries a and a is provided by the same crystal grains b. Accordingly, an amorphous region is not included, thus suppressing degradation of the device characteristic and keeping the carrier mobility in the direction of the channel length L high.

It is therefore possible to prevent non-uniformity in luminance and non-uniformity in color at the display part by configurating a display device using the thin film transistors TFT formed in such a thin film semiconductor device as switching elements.

The foregoing description of the embodiment has been given of the method of preparing a thin film semiconductor device having thin film transistors by adopting the semiconductor processing method according to the invention. The semiconductor processing method according to the invention is not however limited to the application to a method of fabricating a thin film transistor, and can be adapted to methods of fabricating other electronic devices. In any case, an electronic device with a good characteristic accuracy can be acquired by setting the current to flow in a direction crossing the grain boundaries a.

Further, the materials, sources, processes, numerical values, etc. illustrated in the foregoing description of the embodiment are to be considered as illustrative, and materials, sources, processes, and numerical values different from the illustrated ones may be used as needed.

The present application contains subject matter related to that disclosed in Japanese Priority Patent Application JP filed in the Japan Patent Office on Jul. 30, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor processing apparatus comprising:
   a stage configured to receive mounted thereon a substrate having a semiconductor film to be processed is;
   a supply section that includes at least (a) a beam shaper that shapes a laser beam into a top-hat laser beam with a top-hat beam profile and (b) a diffraction grating that modulates the top-hat type laser beam into a plurality of energy beams in which adjacent energy beams have a tangent line therebetween, the supply section being configured to supply the plurality of energy beams onto the semiconductor film mounted on the stage in such a way that irradiation points of the energy beams are linearly aligned on the semiconductor film at given intervals; and
   a control section that (a) moves the plurality of energy beams and the substrate relative to each other in a scan direction that is tilted at an angle relative to the linear alignment of the irradiation points on the semiconductor film, and (b) affects scanning of the semiconductor film with the irradiation points of the plurality of energy beams in parallel to thereby control a heat treatment on the semiconductor film,
   wherein,
      the tangent line is tangential to both footprints of the adjacent energy beams,
      the angle between the linear alignment of energy beams and the scan direction is set such that the scan direction is parallel to the tangent line,
      the angle is such that there is no gap between the footprints of the adjacent energy beams along a direction perpendicular to the scan direction, and
      the semiconductor processing apparatus being effective to form crescent-shaped crystal grains on the semiconductor film that are aligned along the tangent line.

2. The semiconductor processing apparatus according to claim 1, wherein the control section is configured to tilt a direction of the linear alignment of the irradiation points of the plurality of energy beams with respect to the scan direction of the irradiation points thereof.

3. The semiconductor processing apparatus according to claim 1, wherein when performing a heat treatment on the semiconductor film to be a channel portion of a semiconductor device, the control section is configured to control the intervals of the plurality of energy beams, a scan speed thereof, and an amount of energy thereof in such a way that grain boundaries of the semiconductor film which are formed by irradiation of the plurality of energy beams are provided periodically in a lengthwise direction of the channel portion.

4. The semiconductor processing apparatus according to claim 1, wherein the supply section is configured to supply a laser beam with a wavelength of 350 nm to 470 nm as the energy beam.

5. The semiconductor processing apparatus according to claim 1, wherein the supply section is configured to supply a laser beam generated from a semiconductor laser oscillator of a GaN compound as the energy beam.

6. A semiconductor processing method comprising the steps of:
   shaping, using a beam shaper, a laser beam into a top-hat laser beam with a top-hat beam profile;
   modulating, using a diffraction grating, the top-hat type laser beam into a plurality of energy beams in which adjacent energy beams have a tangent line therebetween;
   supplying the plurality of energy beams onto a semiconductor film provided on a substrate to be processed in such a way that irradiation points of the energy beams are linearly aligned on the semiconductor film at given intervals; and
   moving the plurality of energy beams supplied and the substrate relative to each other in a scan direction that is tilted at an angle relative to the linear alignment of the irradiation points on the semiconductor film, and affects scanning the semiconductor film with the irradiation points of the plurality of energy beams in parallel to thereby control a heat treatment on the semiconductor film,
   wherein,
      the tangent line is tangential to both footprints of the adjacent energy beams,
      the angle between the linear alignment of energy beams and the scan direction is set such that the scan direction is parallel to the tangent line,
      the angle is such that there is no gap between the footprints of the adjacent energy beams along a direction perpendicular to the scan direction, and the semiconductor processing method being effective to form crescent-shaped crystal grains on the semiconductor film that are aligned along the tangent line.

7. The semiconductor processing method according to claim 6, wherein in controlling the heat treatment on the semiconductor film, a direction of the linear alignment of the irradiation points of the plurality of energy beams is tilted with respect to the scan direction of the irradiation points thereof.

8. The semiconductor processing method according to claim 6, wherein when performing a heat treatment on the semiconductor film to be a channel portion of a semiconductor device, the intervals of the plurality of energy beams, a scan speed thereof, and an amount of energy thereof are controlled in such a way that grain boundaries of the semiconductor film which are formed by irradiation of the plurality of energy beams are provided periodically in a lengthwise direction of the channel portion.

9. The semiconductor processing method according to claim 6, wherein the scan direction of the plurality of energy beams is turned back in an opposite direction for each stage of a scan area.

* * * * *